United States Patent [19]

Rutledge

[11] Patent Number: 4,725,981
[45] Date of Patent: Feb. 16, 1988

[54] RANDOM ACCESS MEMORY CELL RESISTANT TO INADVERTANT CHANGE OF STATE DUE TO CHARGED PARTICLES

[75] Inventor: James L. Rutledge, Tempe, Ariz.
[73] Assignee: Motorola, Inc., Schaumburg, Ill.
[21] Appl. No.: 825,430
[22] Filed: Feb. 3, 1986
[51] Int. Cl.[4] .............................................. G11C 11/40
[52] U.S. Cl. ....................................... 365/154; 365/190
[58] Field of Search ................ 365/154, 155, 156, 190
[56] References Cited
U.S. PATENT DOCUMENTS 4,130,892 12/1978 Gunckel, II et al. ................ 365/154

Primary Examiner—James W. Moffitt
Attorney, Agent, or Firm—William E. Koch

[57] ABSTRACT

A static MOS RAM cell is provided that is resistant to inadvertent change of state due to charged particles striking the cell without decreasing write time. First and second cross-coupled transistors are coupled between first and second nodes, respectively, and a first voltage. First and second loads are coupled between the first and second nodes, respectively, and a second voltage. A first coupling transistor is coupled between the first node and a first input terminal, and has a gate coupled for receiving a write signal. A second coupling transistor is coupled between the second node and a second input terminal, and has a gate coupled for receiving the write signal. First and second variable loads are coupled between the first node and a gate of the second latching transistor, and the second node and a gate of the first latching transistor, respectively, for providing a resistance in the standby mode and relatively no resistance in the write mode.

11 Claims, 2 Drawing Figures

RANDOM ACCESS MEMORY CELL RESISTANT TO INADVERTANT CHANGE OF STATE DUE TO CHARGED PARTICLES

FIELD OF THE INVENTION

This invention relates in general to static metal-oxide-semiconductor (MOS) random access memories (RAMs) and, more particularly, to a static MOS RAM cell that is resistant to inadvertant change of state due to charged particles striking the cell without decreasing write time.

BACKGROUND OF THE INVENTION

Static MOS RAMs are commonly designed with memory cells having six transistors. A pair of cross-coupled N-channel transistors have their drains connected to a first supply voltage, i.e., ground, their gates connected to first and second nodes, respectively, and their sources connected to the second and first nodes, respectfully. First and second P-channel load transistors have their sources connected to a second supply voltage, i.e., $V_{DD}$, their gates connected to the first and second nodes, respectfully, and their drains connected to the second and first nodes, respectfully. First and second N-channel coupling transistors have their drains connected to the second and first nodes, respectfully, their gates connected to a word line for receiving a write signal, and their sources connected to first and second data sense lines, respectfully.

A plurality of these cells are located in a row defined by each of a plurality of word lines and are located in a column between a plurality of data sense lines. In other words, each cell is uniquely coupled between a combination of word lines and data sense lines. A cell is written when a write signal is applied to the word line and complementary data signals are applied to the first and second data sense lines causing the cell to latch in one of two states. A cell is read when a write signal is applied to the word line and the latched state is sensed by the signal appearing on the first and second data sense lines. In a standby mode, the N-channel coupling transistors are disabled by removing the write signal and the N-channel cross-coupled transistors will remain latched.

However, this cell is subject to an inadvertant change of state in the standby mode due to charged particles, i.e., alpha particles, x-ray or other source of ionizing radiation, striking the first or second node and discharging the voltage thereupon. Previous attempts to overcome this problem have included placing a first resistor between the first node and the gates of the second N-channel transistor of the cross-coupled pair and the second P-channel load transistor, and placing a second resistor between the second node and the gates of the first N-channel transistor of the cross-coupled pair and the first P-channel load transistor. This presents a resistor-capacitor (RC) time constant that substantially prevents an inadvertant change of state, when the resistor is large, due to charged particles striking the first or second nodes by allowing the P-channel load transistors to recharge the nodes before the voltage on the gates on the transistors on the opposite side of the cell may be removed.

However, these resistors cause a substantial reduction in write time by delaying the data signal applied at the first and second nodes from appearing at the gates of the transistors on the other side of the cell.

Therefore, a memory cell is needed that is resistant to changing state due being struck by charged particles without sacrificing write time.

SUMMARY OF THE INVENTION

Accordingly, it is an object of the present invention to provide an improved RAM cell.

Another object of the present invention to provide an improved RAM cell that is resistant to an inadvertant change of state due to being struck by charged particles.

A further object of the present invention to provide an improved RAM cell that is resistant to inadvertantly changing state due to being struck by charged particles without sacrificing write time.

In carrying out the above and other objects of the invention in one form, there is provided a static RAM cell that is resistant to inadvertant change of state due to charged particles striking the cell without decreasing write time. First and second cross-coupled transistors are coupled between first and second nodes, respectively, and a first voltage. First and second loads are coupled between the first and second nodes, respectively, and a second voltage. A first coupling transistor is coupled between the first node and a first input terminal, and has a gate coupled for receiving a write signal. A second coupling transistor is coupled between the second node and a second input terminal, and has a gate coupled for receiving the write signal. Means are coupled between both the first node and a gate of the second latching transistor, and the second node and a gate of the first latching transistor, for providing a resistance in the standby mode and relatively no resistance in the write mode.

The above and other objects, features, and advantages of the present invention will be better understood from the following detailed description taken in conjunction with the accompanying drawing.

DETAILED DESCRIPTION OF THE INVENTION

Figure 1:
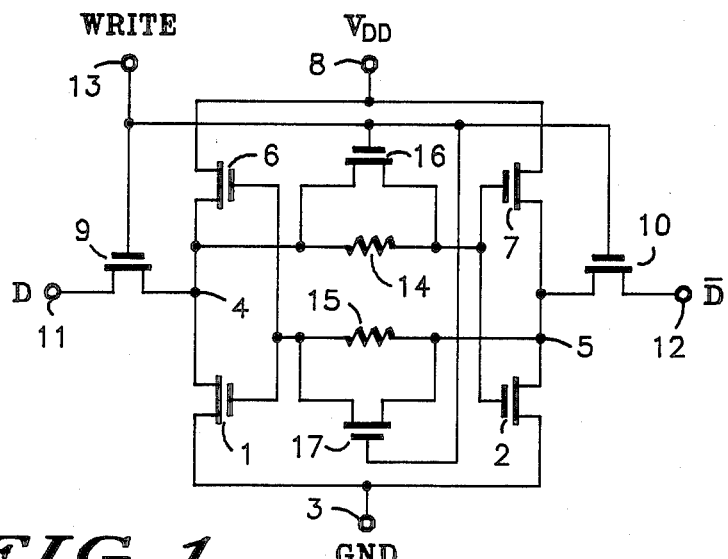
FIG. 1 is a schematic of the preferred embodiment of the invention.

Referring to FIG. 1, the memory cell in accordance with the present invention is shown which is suitable to be fabricated in monolithic integrated circuit form. Cross-coupled N-channel transistors 1 and 2 have their drains connected to voltage terminal 3, typically ground; their sources connected to nodes 4 and 5, respectively; and their gates connected to the gates of P-channel load transistors 6 and 7, respectively. Transistors 6 and 7 have their sources connected to voltage terminal 8, typically $V_{DD}$; and their drains connected to nodes 4 and 5, respectively. N-channel coupling transistors 9 and 10 have their sources connected to data input terminals 11 and 12, respectively, their gates connected to write input signal terminal 13, and their drains connected to nodes 4 and 5, respectively.

As is well known to those skilled in the art, there are three modes for the memory cell shown, including a write mode, standby mode, and read mode. In the write mode, data signals D and $\overline{D}$ are applied to terminal 11 and 12 by a write buffer (not shown) and a write signal is applied to terminal 13. Transistors 1 and 2 will latch and maintain this state after the write signal is removed (standby mode). In the read mode, a write signal is applied to terminal 12 and the voltages (states) on nodes 4 and 5 are sensed by a sense amplifier (not shown) coupled to terminals 11 and 12.

Resistor 14 is coupled between node 4 and the gates of transistors 2 and 7, and resistor 15 is coupled between node 5 and the gates of transistors 1 and 6. Resistors 14 and 15 have substantially a linear effect on the write time of the memory cell. For example, if the write time of the cell without these resistors is 11 nanoseconds, 50,000 ohm resistors will cause a write time of about 14 nanoseconds, and 100,000 ohm resistors will cause a write time of about 17 nanoseconds. Without resistors 14 and 15 in the circuit, i.e., replaced by a direct connection between both nodes 4 and 5 and the gates of the respective transistors, a charged particle, i.e., alpha particle, striking node 4 or 5 would discharge the voltage on the respective node and gates of the transistors connected thereto, and cause the memory cell to change state before voltage $V_{DD}$ could recharge the appropriate node through either transistor 6 or 7.

When the voltage on the node being hit by the particle is high, and without resistors 14 and 15 in the circuit, a particle charged to about 2.0 picocoulombs that strikes node 4 or 5 will cause the memory cell to change state. A resistor value of 10,000 ohms will raise the charge to about 4.0 picocoulombs required for a change of state, and a resistor value of 100,000 ohms will raise the charge to about 11.0 picocoulombs required for a change of state.

When the voltage on the node being hit by the particle is low, and without resistors 14 and 15 in the circuit, a particle charged to about 0.8 picocoulombs that strikes node 4 or 5 will cause the memory cell to change state. A resistor value of 10,000 ohms will raise the charge to about 3.0 picocoulombs required for a change of state, and a resistor value of 100,000 ohms will raise the charge to about 500.0 picocoulombs required for a change of state.

In accordance with the present invention, transistor 16 has its source and drain connected in parallel with resistor 14 and its gate connected to input terminal 13. Transistor 17 has its source and drain connected in parallel with resistor 15 and its gate connected to input terminal 13. In the standby mode, there is not a write signal applied to terminal 13 and transistors 16 and 17 will be disabled. Therefore, resistors 14 and 15 are "in" the circuit and will prevent a charged particle from discharging nodes 4 and 5. When a write signal is applied to terminal 13, transistors 16 and 17 will short out resistors 14 and 15, respectively, effectively "removing" them from the circuit. Therefore, resistors 16 and 17 will not slow down the write time of the memory cell by hindering data signals D and $\overline{D}$ from changing the states of cross-coupled transistors 1 and 2.

The transistors described for the present invention that are N-channel or P-channel, may alternatively be P-channel or N-channel, depending upon the voltages applied to the circuit. For example, transistors 11, 12, 16, and 17 may be P-channel transistors if the write signal were inverted.

Figure 2:
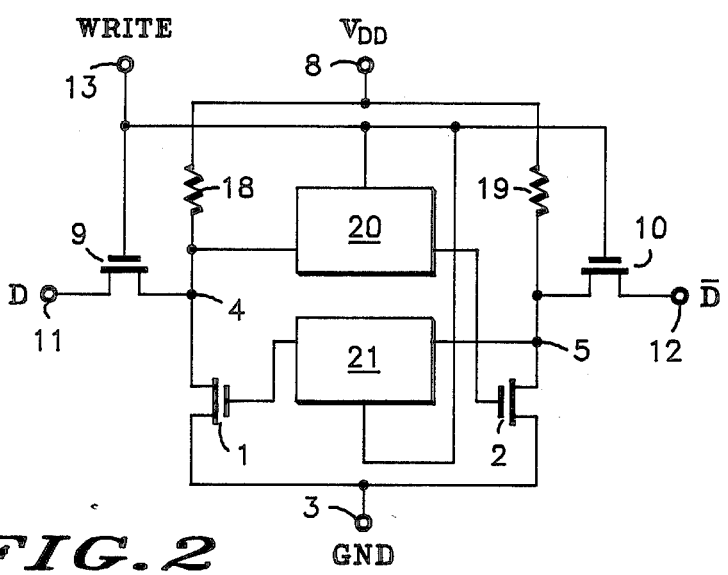
FIG. 2 is a schematic of a second embodiment of the invention.

Referring to FIG. 2, a more general embodiment of the present invention is shown that comprises resistors 18 and 19 replacing transistors 6 and 7 of FIG. 1 and devices 20 and 21 replacing resistors 14 and 15 and transistors 16 and 17 of FIG. 1. Resistors 18 and 19 may alternatively be any type of semiconductor device that provides a resistive load. Devices 20 and 21 may be any type of semiconductor device that provides a resistance that varies from substantially a small resistance when the write signal is in one state and substantially a large resistance when the write signal is in another state. For example, devices 20 and 21 may be a leaky transistor which would conduct some current in the off state, or a depletion device which would allow some current with the gate off and would function as a transistor with the gate on.

By now it should be appreciated that there has been provided a static MOS RAM that is resistant to inadvertent change of state due to charged particles striking the cell without decreasing write time.

I claim:

1. A memory cell having a first data line, a second data line, a first input terminal and a second input terminal, said memory cell comprising:
    a pair of cross-coupled transistors coupled between first and second nodes, respectively, and a first voltage;
    first means coupled between said first node and a second voltage for providing a resistance;
    second means coupled between said second node and said second voltage for providing a resistance;
    third means coupled between said first node and said first input terminal and coupled for receiving a write signal for coupling a first input signal to said first node;
    fourth means coupled between said second node and said second input terminal and coupled for receiving a write signal for coupling a second input signal to said second node;
    fifth means coupled for receiving said write signal and coupled between said first node and the gate of one of said pair of cross-coupled transistors for varying the resistance therebetween in response to said write signal; and
    sixth means coupled for receiving said write signal and coupled between said second node and the gate of the other of said pair of cross-coupled transistors for varying the resistance therebetween in response to said write signal.

2. The memory cell according to claim 1 wherein said fifth and sixth means respectively comprise a first and second depletion device wherein a substantially small amount of current would flow therethrough when said write signal is in one state and a substantially larger amount of current would flow therethrough when said write signal is in another state.

3. The memory cell according to claim 1 wherein said fifth and sixth means respectively comprise a first resistor and a first bypass transistor in parallel and a second resistor and a second bypass transistor in parallel, said first and second bypass transistors having a gate coupled for receiving said write signal.

4. The memory cell according to claim 3 wherein said first and second means respectively comprise a third and fourth resistor.

5. The memory cell according to claim 3 wherein said first and second means respectively comprise a first and second load transistor having a gate coupled to said second and first node, respectively, by said sixth and fifth means, respectively.

6. The memory cell according to claim 3 wherein said third and fourth means respectively comprise a first and second coupling transistor having a gate coupled for receiving said write signal.

7. A memory cell having a first data line, a second data line, and a word line, said memory cell comprising:
- a first latching transistor coupled between a first voltage and a first node;
- a second latching transistor coupled between said first voltage and a second node;
- a first load coupled between said first node and a second voltage;
- a second load coupled between said second node and said second voltage;
- a first coupling transistor coupled between said first node and a first input signal, and having a gate coupled for receiving a write signal;
- a second coupling transistor coupled between said second node and a second input signal, and having a gate coupled for receiving said write signal;
- first means coupled for receiving said write signal and between said first node and a gate of said second latching transistor for varying the resistance therebetween in response to said write signal; and
- second means coupled for receiving said write signal and between said second node and a gate of said first latching transistor for varying the resistance therebetween in response to said write signal.

8. The memory cell according to claim 7 wherein said first and second means respectively comprise a first and second depletion device wherein a substantially small amount of current would flow therethrough when said write signal is in one state and a substantially larger amount of current would flow therethrough when said write signal is in another state.

9. The memory cell according to claim 7 wherein said first and second means respectively comprise a first resistor and a first bypass transistor in parallel and a second resistor and a second bypass transistor in parallel, said first and second bypass transistors having a gate coupled for receiving said write signal.

10. The memory cell according to claim 9 wherein said first and second loads respectively comprise a first and second load transistor, each having a gate coupled to the gate of said first and second latching transistors, respectfully.

11. The memory cell according to claim 9 wherein said first and second loads respectively comprise a first and second resistor.

* * * * *